United States Patent
Zhou et al.

(10) Patent No.: US 9,190,859 B1
(45) Date of Patent: Nov. 17, 2015

(54) VOLTAGE REFERENCE BUFFER USING VOLTAGE BATTERY LEVEL SHIFTER

(75) Inventors: Hao Zhou, Shanghai (CN); Yonghua Song, Cupertino, CA (US); Tao Shui, San Jose, CA (US); Jie Jiang, Shanghai (CN)

(73) Assignee: MARVELL INTERNATIONAL LTD. (BM)

( * ) Notice: Subject to any disclaimer, the term of this patent is extended or adjusted under 35 U.S.C. 154(b) by 1077 days.

(21) Appl. No.: 13/115,813

(22) Filed: May 25, 2011

Related U.S. Application Data

(60) Provisional application No. 61/351,574, filed on Jun. 4, 2010.

(51) Int. Cl.
*H02J 7/00* (2006.01)

(52) U.S. Cl.
CPC .................................. *H02J 7/0054* (2013.01)

(58) Field of Classification Search
CPC ...................................................... H02J 7/0054
USPC ......... 320/166, 103, 107, 167; 307/46, 64, 66
See application file for complete search history.

(56) References Cited

U.S. PATENT DOCUMENTS

| | | | | |
|---|---|---|---|---|
| 5,982,645 A | * | 11/1999 | Levran et al. | 363/37 |
| 6,184,726 B1 | * | 2/2001 | Haeberli et al. | 327/96 |
| 6,940,292 B2 | * | 9/2005 | Lalla | 324/661 |
| 7,167,029 B2 | * | 1/2007 | Soeraasen | 327/91 |
| 7,453,305 B2 | * | 11/2008 | Moane et al. | 327/307 |
| 8,552,788 B2 | * | 10/2013 | Ivanov | 327/333 |
| 2008/0061857 A1 | * | 3/2008 | Kapusta | 327/337 |
| 2011/0074431 A1 | * | 3/2011 | Li | 324/426 |

* cited by examiner

*Primary Examiner* — Yalkew Fantu

(57) ABSTRACT

In one embodiment, an apparatus includes a first supply voltage and a second supply voltage. Level shifter circuitry is configured as a first voltage battery to shift a first voltage and a second voltage battery to shift a second voltage. A first circuit receives the shifted first voltage and sets a third voltage, and receives the shifted second voltage and sets a fourth voltage. The shifted first voltage is greater than the first supply voltage and the shifted second voltage level is less than the second supply voltage. A second circuit sets a fifth voltage and a sixth voltage. The fifth voltage follows the third voltage and the sixth voltage following the fourth voltage.

20 Claims, 7 Drawing Sheets

VOLTAGE REFERENCE BUFFER USING VOLTAGE BATTERY LEVEL SHIFTER

CROSS REFERENCE TO RELATED APPLICATIONS

The present disclosure claims priority to U.S. Provisional App. No. 61/351,574 for "Novel High Speed Voltage Buffer for Switched Capacitor Data Converters" filed Jun. 4, 2010, which is incorporated herein by reference in its entirety for all purposes.

BACKGROUND

Particular embodiments generally relate to reference generators.

Unless otherwise indicated herein, the approaches described in this section are not prior art to the claims in this application and are not admitted to be prior art by inclusion in this section.

High-speed data converters use internal reference buffers to provide references. For example, the references may be provided to an analog to digital converter (ADC). FIG. 1 shows a conventional voltage reference buffer. Transistors M1 and M2 share a same current Id1 to generate output voltages Vrp and Vrn. The gate voltages Vg1 and Vg2 of transistors M1 and M2, respectively, are biased by a replica circuit (e.g., a transistor M3, a resistor R2, and a transistor M4) such that output voltage Vrp is set at 1.3V and output voltage Vrn is set at 0.3V.

A resistor R1 is adjusted to establish current Id1 as (voltage Vrp−voltage Vrn)/resistance R1, where current Id1 is directly related to the noise performance of the reference buffer. In operation, the voltage Vrp will go down at a moment when the reference voltage buffer is switched to sampling capacitors of the ADC. At this time, the current going through transistor M1 increases and the equivalent output impedance drops to help bring voltage Vrp up. The mechanism for the negative output voltage Vrn is the same, except that the swing direction is in the opposite direction.

In some cases, gate voltages Vg1 and Vg2 may need to go beyond power supply voltages of Vdd and Vss because of the voltage levels of output voltages Vrp and Vrn, respectively. For example, gate voltage Vg1 needs to be above the output voltage Vrp plus the threshold voltage of transistor M1 and gate voltage Vg2 needs to be below the output voltage Vrn plus the threshold voltage of transistor M2.

Positive and negative boosted voltages Vdd2 and Vss2 are generated to overcome the above problem. Voltages Vdd2 and Vss2 are used to supply the minimum required currents to set up the desired voltages Vg1 and Vg2. Voltages Vdd2 and Vss2 may be generated on an integrated circuit (IC) chip that includes the voltage reference buffer. For example, a charge pump that includes a flying capacitor may be used to generate voltages Vdd2 and Vss2. In this case, the flying capacitor takes up area on the chip.

Also, the current through transistors M5 and M8 may be about 100-200 μA. The current is delivered by the on-chip charge pump, which requires a certain size of flying capacitor. This increases the area used and also power consumption. A power supply ripple is also introduced that may reduce the accuracy of the voltage reference buffer.

FIG. 2 depicts a second conventional voltage reference buffer 200. Reference buffer 200 uses two positive supply reference voltages Vdd1 and Vdd2, and one ground voltage Vss. The negative reference voltage Srefn is delivered by a constant current sink. Bias currents through first and second transistor followers 25 and 26 are provided by first and second current transistors 29 and 30 in response to a bias voltage Vb. Transistor followers 25 and 26 convert first and second voltage signals at the gates of transistor followers 25 and 26 to first and second reference signals Srefp and Srefn.

When reference buffer 200 is coupled to dynamic charge sampling capacitors of an ADC, a transient voltage at voltage Srefn goes up at the moment when reference buffer 200 is switched to the sampling capacitors. Voltage Srefn is then pulled down by the constant current sink of transistor 30, and not by positive feedback mechanism. Thus, the settling speed of voltage Srefn is limited by the constant current sink. Further, because the current sink through transistor 30 is constant, the constant current needs to be high such that enough current can be sinked to increase voltage Srefn. This increases the power used and also limits the amount of current that can be sunk. Also, a charge pump may be needed to generate the boosted positive supply voltage Vdd1, which increases the area used on the chip as described above.

SUMMARY

In one embodiment, an apparatus includes a first supply voltage and a second supply voltage. Level shifter circuitry is configured as a first voltage battery to shift a first voltage and a second voltage battery to shift a second voltage. A first circuit receives the shifted first voltage and sets a third voltage, and receives the shifted second voltage and sets a fourth voltage. The shifted first voltage is greater than the first supply voltage and the shifted second voltage level is less than the second supply voltage. A second circuit sets a fifth voltage and a sixth voltage. The fifth voltage follows the third voltage and the sixth voltage following the fourth voltage.

In one embodiment, the first circuit and the second circuit source current when the fifth voltage falls below a first level and the first circuit and the second circuit sink current when the sixth voltage rises above a second level.

In one embodiment, the first voltage battery and the second voltage battery provide a direct current (DC) shift.

In another embodiment, an apparatus includes a first supply voltage and a second supply voltage. A first amplifier receives i) a first reference voltage and ii) a first feedback voltage, and outputs a first comparison signal. A first level shifter is configured as a first voltage battery to shift a first comparison voltage determined from the first comparison signal. A first transistor receives the shifted first comparison voltage as a first gate voltage and sets the first feedback voltage. The first gate voltage is greater than the first supply voltage. A second transistor sets a first output voltage. The first output voltage follows the first feedback voltage. A second amplifier receives i) a second reference voltage and ii) a second feedback voltage, and outputs a second comparison signal. A second level shifter is configured as a second voltage battery to shift a second comparison voltage determined from the second comparison signal. A third transistor receives the shifted second comparison signal as a second gate voltage and sets the second feedback voltage. The second gate voltage is less than the second supply voltage. A fourth transistor sets a second output voltage. The second output voltage follows the second feedback voltage.

In one embodiment, the first level shifter and the second level shifter do not provide a constant current.

In one embodiment, the first voltage battery and the second voltage battery provide a direct current (DC) shift of the first comparison voltage and the second comparison voltage, respectively.

In another embodiment, a method includes shifting a first voltage using a first voltage battery; shifting a second voltage using a second voltage battery; receiving the shifted first voltage and setting a third voltage, wherein the shifted first voltage is greater than a first supply voltage; receiving the shifted first voltage and setting a fourth voltage, wherein the shifted second voltage is less than a second supply voltage; setting a fifth voltage based on the shifted first voltage, the fifth voltage following the third voltage; and setting a sixth voltage based on the shifted second voltage, the sixth voltage following the fourth voltage.

The following detailed description and accompanying drawings provide a more detailed understanding of the nature and advantages of the present invention.

DETAILED DESCRIPTION

Described herein are techniques for a voltage reference buffer. In the following description, for purposes of explanation, numerous examples and specific details are set forth in order to provide a thorough understanding of embodiments of the present invention. Particular embodiments as defined by the claims may include some or all of the features in these examples alone or in combination with other features described below, and may further include modifications and equivalents of the features and concepts described herein.

Figure 3:
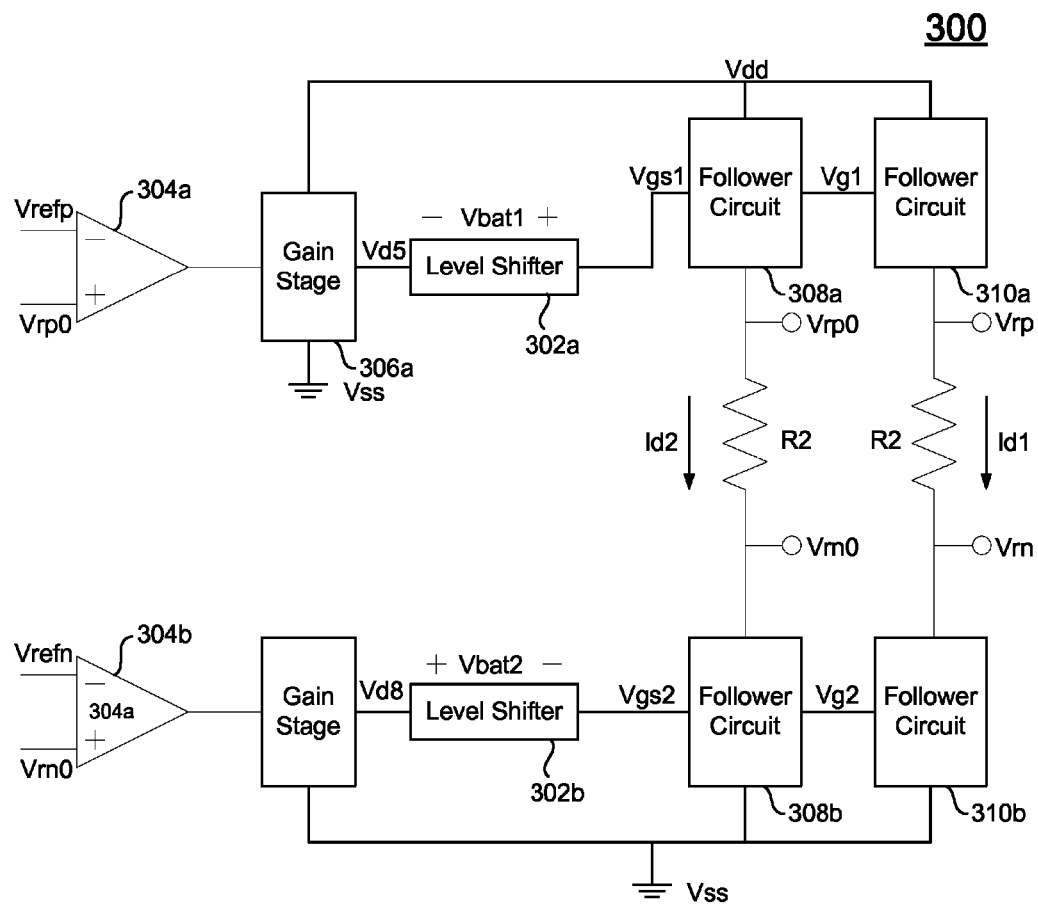
FIG. 3 depicts a voltage reference buffer according to one embodiment.

FIG. 3 depicts a voltage reference buffer 300 according to one embodiment. Voltage reference buffer 300 uses one positive supply Vdd and one negative supply ground Vss. In one embodiment, supplies Vdd and Vss are the only supplies used by voltage reference buffer 300 to generate output voltages Vrp and Vrn. Accordingly, an on-chip charge pump may not be needed to generate additional boosted supply voltages. This reduces the chip area and also power consumption.

Output voltages Vrp and Vrn are set by a current Id1. A resistor R1 is adjusted to establish the current Id1. In operation, a first amplifier 304a receives a reference voltage Vrefp and a voltage Vrp0. Voltage Vrp0 is received in a feedback loop from an output node Vrp0. A second amplifier 304b receives a second reference voltage Vrefn and a voltage Vrn0. Voltage Vrn0 is received in a feedback loop from an output node Vrn0. Due to the feedback loop, voltages Vrp0 and Vrn0 track reference voltages Vrefp and Vrefn, respectively. Also, voltages Vrp and Vrn follow voltages Vrp0 and Vrn0, respectively.

A level shifter 302a and a level shifter 302b are used to achieve the gate voltages Vg1 and Vg2 that are needed. This concept will be described in more detail below with respect to FIG. 4. Level shifters 302a and 302b may include voltage batteries. A first voltage battery Vbat1 may increase a voltage level and a second voltage battery Vbat2 may reduce a voltage level. A voltage battery may be a circuit that increases a direct current (DC) voltage.

An implementation of the voltage batteries will be described below.

In operation, amplifier 304a compares reference voltage Vrefp and voltage Vrp0, and outputs a comparison signal. Gain stage 306a may amplify the comparison signal to a voltage Vd5. Level shifter 302a may then shift the level of the voltage Vd5 output by gain stage 306a to a gate voltage Vgs1 that is input into a follower circuit 308a. Gate voltage Vgs1 is mirrored to follower circuit 310a as a gate voltage Vg1.

In the negative direction, amplifier 304b compares reference voltage Vrefn and voltage Vrn0, and outputs a comparison signal. Gain stage 306b may amplify the comparison signal to a voltage Vd8. Level shifter 302b may then shift the level of the voltage Vd8 output by gain stage 306b to a gate voltage Vgs2 that is input into a follower circuit 308b. Gate voltage Vgs2 is mirrored to follower circuit 310b as a gate voltage Vg2.

As will be discussed below, the gate voltage Vg1 of a transistor (not shown) in follower circuit 310a may need to go beyond power supply voltage Vdd due to the voltage level at node Vrp. The similar case occurs for a gate voltage Vg2 of a transistor (not shown) in follower circuit 310b, but in the opposite direction. Level shifter 302a increases the voltage output by gain stage 306a when a voltage is needed that is beyond power supply voltage Vdd. Similarly, level shifter 302b decreases the voltage output by gain stage 306b when a voltage is needed that is below power supply voltage Vss. This allows the required current Id1 to set up output voltages Vrp and Vrn.

In one embodiment, output voltages Vrp and Vrn are used as references in a digital video disk (DVD) player. For example, these reference voltages may be used for an analog-to-digital converter (ADC), such as a pipelined ADC or flash ADC in the DVD player. The reference voltages may be coupled to sampling capacitors in a sample and hold circuit of the ADC to charge the sampling capacitors to desired voltages. In other embodiments, voltage reference buffer may be used in other designs that include a switched capacitor. A first switch may be used to couple voltage Vrp to a first sampling capacitor and a second switch is used to couple voltage Vrn to a second sampling capacitor. The first and second switches are opened and closed. When the first or second switch transitions from an open to closed state, output voltages Vrp or Vrn may be affected. For example, the output voltage Vrp may go down or the output voltage Vrn may go up when voltage reference buffer 300 is coupled to sampling capacitors of the ADC. A feedback mechanism is used to maintain the output voltages Vrp and Vrn at their desired levels by sourcing current to increase voltage Vrp and by sinking current to decrease voltage Vrn.

In the feedback mechanism, the output of level shifter 302a produces a current Id2 through resistor R2. This sets the voltages Vrp0 and Vrn0. As discussed above, voltages Vrp0 and Vrn0 are fed back into amplifiers 304a and 304b. The feedback is used to adjust the output voltages Vrp0 and Vrn0 such that they track the reference voltages Vrefp and Vrefn, respectively (e.g., 1.3V and 0.3V, respectively). Output voltages Vrn and Vrp also follow voltages Vrp0 and Vrn0, respectively. For example, follower circuit 310a and follower circuit 310b are designed to follow follower circuit 308a and follower circuit 308b. Thus, output voltages Vrp and Vrn may be adjusted according to the feedback using voltages Vrp0 and Vrn0, when disturbances cause output voltages Vrp and Vrn to move. The feedback mechanism will be described in more detail below.

Figure 4:
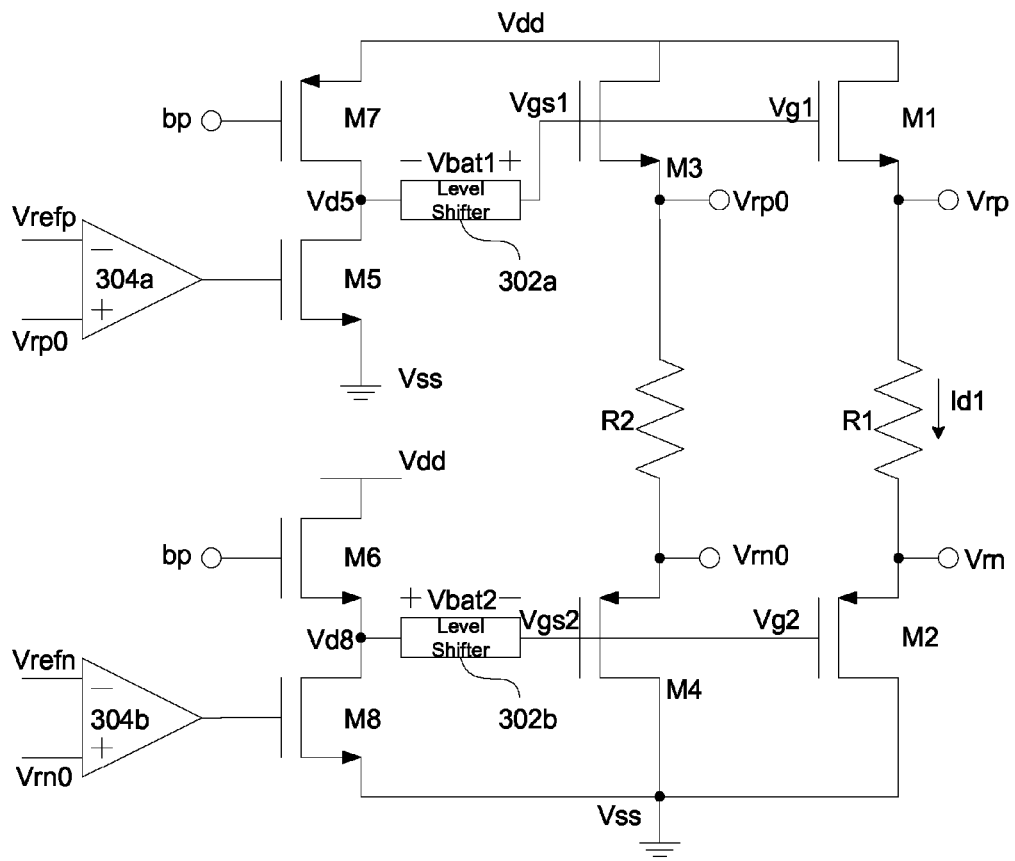
FIG. 4 depicts a more detailed example of the voltage reference buffer according to one embodiment.

FIG. 4 depicts a more detailed example of voltage reference buffer 300 according to one embodiment. As shown, a transistor M1 and a transistor M2 are biased by gate voltages Vg1 and Vg2, respectively. Transistors M1 and M2 share a same current Id1 through resistor R1. Output voltages Vrp and Vrn are set based on the value of resistor R1 and the current Id1. The output impedances at output nodes for voltages Vrp and Vrn are set by the transductance of transistors M1 and M2 (e.g., 1/gm1 and 1/gm2, respectively). The output impedances are low to reduce the noise of voltage reference buffer 300.

Because of the level of output voltages Vrp and Vrn, gate voltages Vg1 and Vg2 may need to go beyond power supply voltage Vdd. This is because voltage Vrp plus the threshold voltage of transistor M1 may require a voltage at the gate of transistor M1 to be greater than Vdd. For transistor M2, voltage Vrn plus the threshold voltage of transistor M2 may require a more negative voltage than Vss to keep transistor M2 turned on. Accordingly, level shifters 302a and 302b are used to bias gate voltages Vg1 and Vg2, respectively. This allows voltage reference buffer 300 to operate with one positive supply Vdd and one negative supply ground Vss. In one embodiment, an additional positive or negative supply other than supply Vdd and supply Vss is not needed to generate output voltages Vrp and Vrn.

In operation, a transistor M5 and a transistor M7 form gain stage 306a. Transistor M5 receives the output comparison signal of amplifier 304a. The output comparison signal of amplifier 304a depends on the comparison of voltage Vrp0 and reference voltage Vrefp. Transistor M7 receives a bias voltage (bp) that sets a drain voltage Vd5. The drain voltage Vd5 may be an amplified voltage of the output comparison signal from amplifier 304a.

Level shifter 302a may then shift the drain voltage Vd5. For example, level shifter 302a provides a DC shift of drain voltage Vd5, which increases a gate voltage Vgs1 at a gate of transistor M3 and a gate voltage Vg1 at the gate of transistor M1. The gate voltages Vgs1 and Vg1 are shifted such that transistors M3 and M1, respectively, are sufficiently biased to have them turned on. For example, gate voltage Vgs1 is greater than voltage Vrp0 plus a threshold voltage of transistor M3 and gate voltage Vg1 is greater than voltage Vrp plus a threshold voltage of transistor M1.

For output voltage Vrn, a similar structure is provided but in the opposite swing direction. For example, a transistor M8 receives the output comparison signal from an amplifier 304b. Using a transistor M6 that is biased by bias voltage bp, a voltage Vd8 is set at the drains of transistors M6 and M8. Level shifter 302b is configured to shift the voltage level of voltage Vd8 down. The voltage is shifted down such that a gate voltage Vgs2 at transistor M4 and gate voltage Vg2 at transistor M2 are at a level such that transistors M4 and M2, respectively, are turned on. For example, gate voltage Vgs2 is less than voltage Vrn0 plus a threshold voltage of transistor M4 and gate voltage Vg2 is less than voltage Vrn plus a threshold voltage of transistor M2.

Figure 5A:
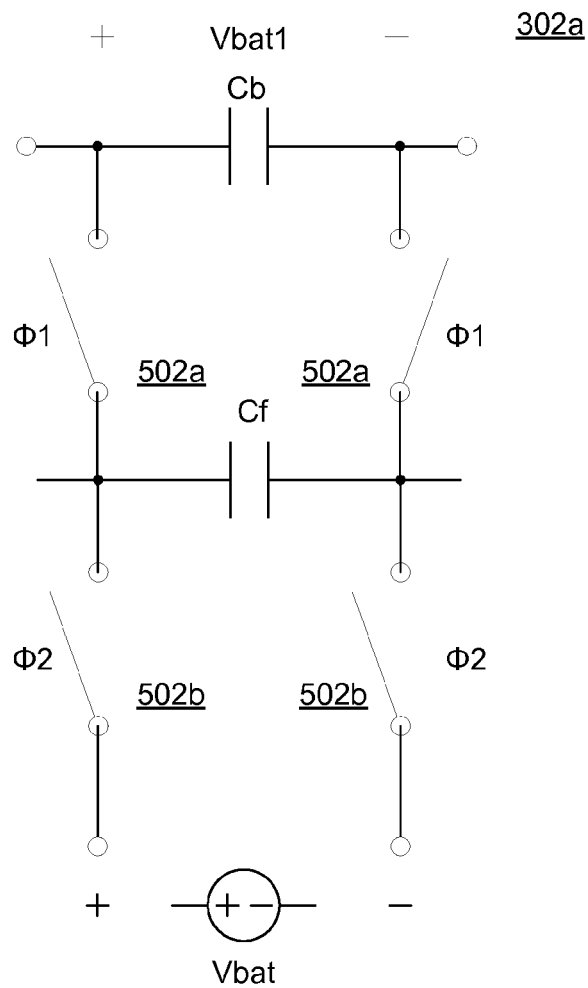
FIG. 5a shows an example of a level shifter according to one embodiment.
Figure 5B:
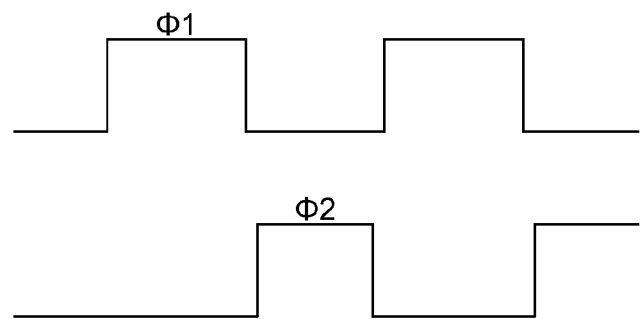
FIG. 5b depicts signals Φ1 and Φ2 used to open and close switches of the level shifter according to one embodiment.

FIG. 5a shows an example of level shifter 302a according to one embodiment. Level shifter 302a includes a capacitor Cb and a flying capacitor Cf that form a switched capacitor design. The switched capacitor design switches from coupling a voltage battery Vbat to flying capacitor Cf, and then coupling flying capacitor Cf to capacitor Cb. The couplings are controlled by switches 502a and 502b, which are opened and closed according to signals Φ1 and Φ2 shown in FIG. 5b.

In an implementation, switches 502a are closed when signal Φ1 is high (switches 502b are also open during this time because signal Φ2 is low), and a charge from flying capacitor Cf is transferred to capacitor Cb. Capacitor Cb may be coupled between voltage Vd5 and gate voltage Vgs1. The transfer of charge increased the gate voltage Vg1 at transistor M1. When signal Φ1 is low, switches 502a are opened. Also, signal Φ2 is high, which closes switches 502b, and couples voltage battery Vbat to flying capacitor Cf. This charges flying capacitor Cf. The process continues as switches 502b are opened and switches 502a are closed to transfer the charge as discussed above from flying capacitor Cf to capacitor Cb. Level shifter 302b may operate similarly except that the voltage polarities are reversed.

Figure 1:
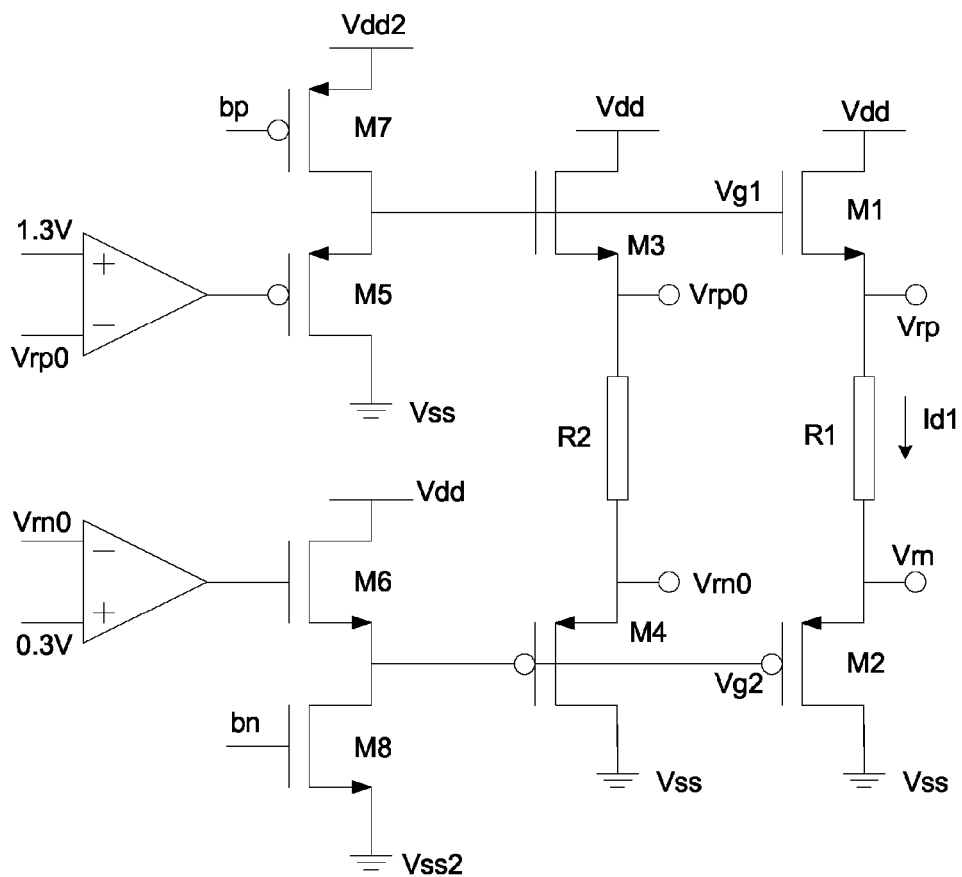
FIG. 1 shows a conventional voltage reference buffer.
Figure 2:
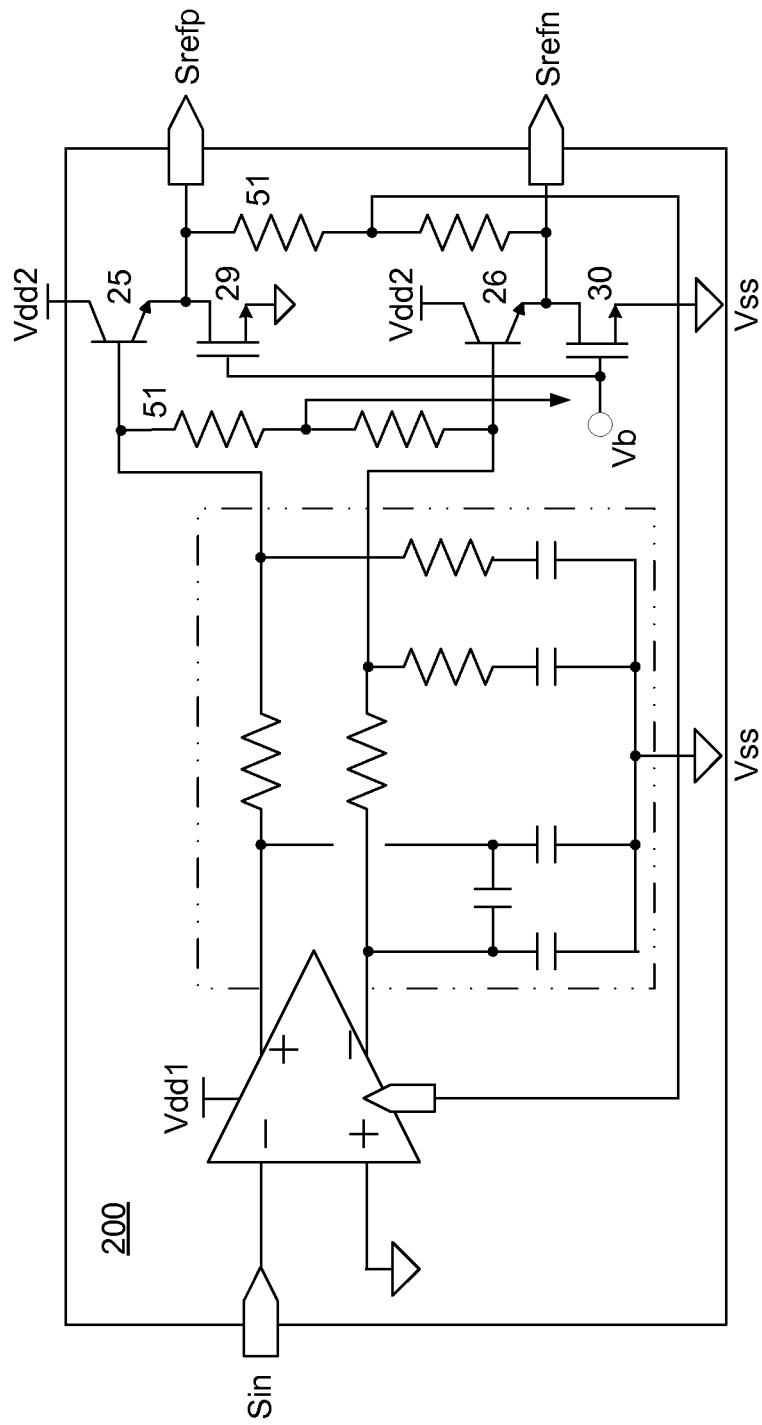
FIG. 2 depicts a second conventional voltage reference buffer.

Level shifter 302a is inserted in between the gate of transistor M3 and the drains of transistors M5 and M7 and thus, level shifter 302a does not supply any constant current. As a result, the flying capacitor Cf and capacitor Cb may use less area due to not having to supply constant current, such as less area than capacitors used in a charge pump described in FIGS. 1 and 2. Accordingly, the area of level shifter 302 may be small when compared to a convention on-chip charge pump.

The timing of signals Φ1 and Φ2 are set such that they do not generate a ripple during a sample and hold period while dynamically charging sampling capacitors in the ADC. For example, flying capacitor Cf may not be charging capacitor Cb when voltage reference buffer 300 is coupled to the sampling capacitors. Thus, the accuracy of voltage reference buffer 300 may be higher than the conventional reference buffers shown in FIG. 1 and FIG. 2.

Also, the amount of current that can be sourced through transistors M3 and M1, or sinked through transistors M4 and M2 is not limited. This also provides a low impedance at the output.

Figure 6:
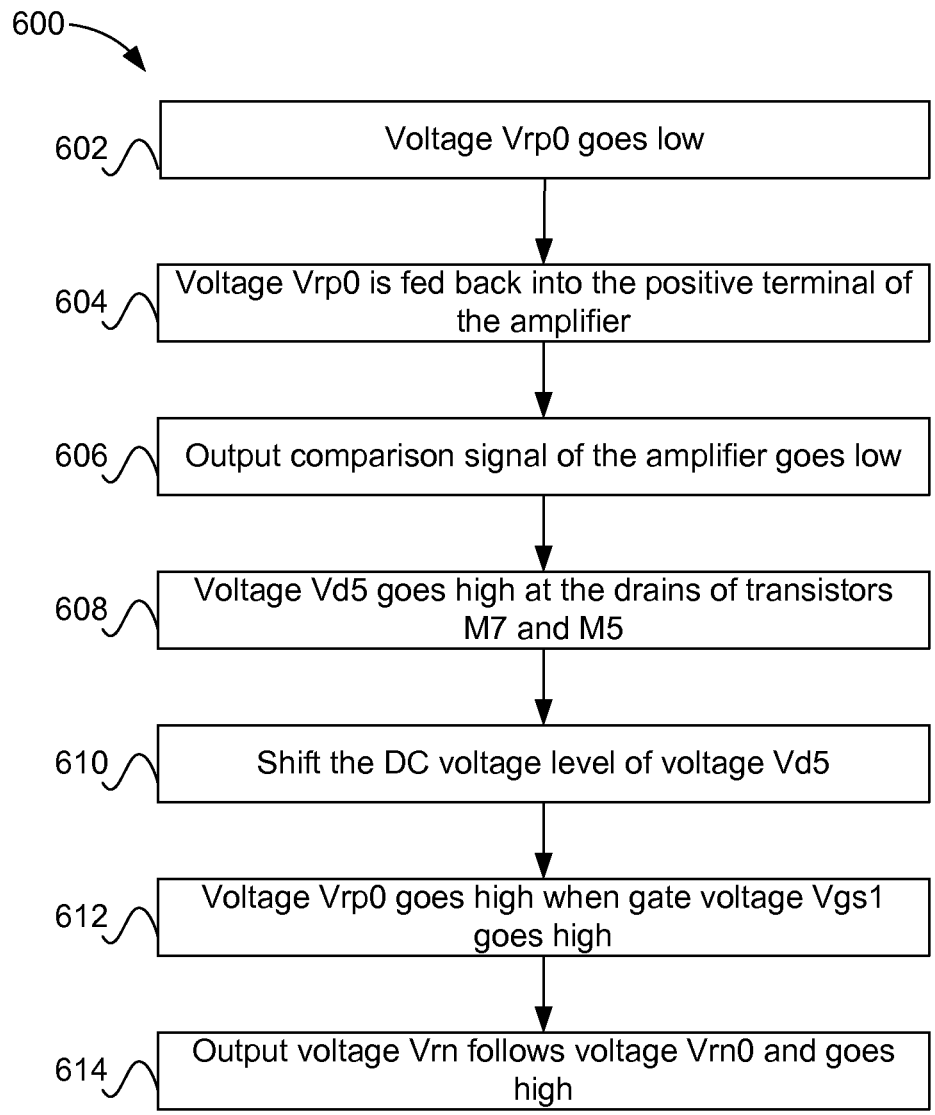
FIG. 6 depicts a simplified flowchart of a method for providing a feedback mechanism using voltage Vrp0 according to one embodiment.

The feedback mechanism will now be described in more detail. As discussed above, voltages Vrp0 and Vrn0 track reference voltages Vrefp and Vrefn, respectively, due to the feedback mechanism. Also, voltages Vrp and Vrn follow voltage Vrp0 and Vrn0, respectively. FIG. 6 depicts a simplified flowchart 600 of a method for providing a feedback mechanism using voltage Vrp0 according to one embodiment. At 602, a voltage Vrp0 goes low. For example, voltage Vrp0 may decrease due to output node Vrp being coupled to the sampling capacitors of the ADC.

At 604, voltage Vrp0 is fed back into the positive terminal of amplifier 304a. At 606, the output comparison signal of amplifier 304a goes low because the voltage Vrp0 is below reference voltage Vrefp.

At 608, a voltage Vd5 goes high at the drains of transistors M7 and M5. At 610, level shifter 302a also shifts the DC voltage level of voltage Vd5 to increase voltage Vd5. This causes the gate voltage Vgs1 of transistor M3 to go high. At 612, voltage Vrp0 goes high when gate voltage Vgs1 goes high. This increases the voltage at Vrp0. At 614, output voltage Vrp follows voltage Vrp0 and goes high.

Figure 7:
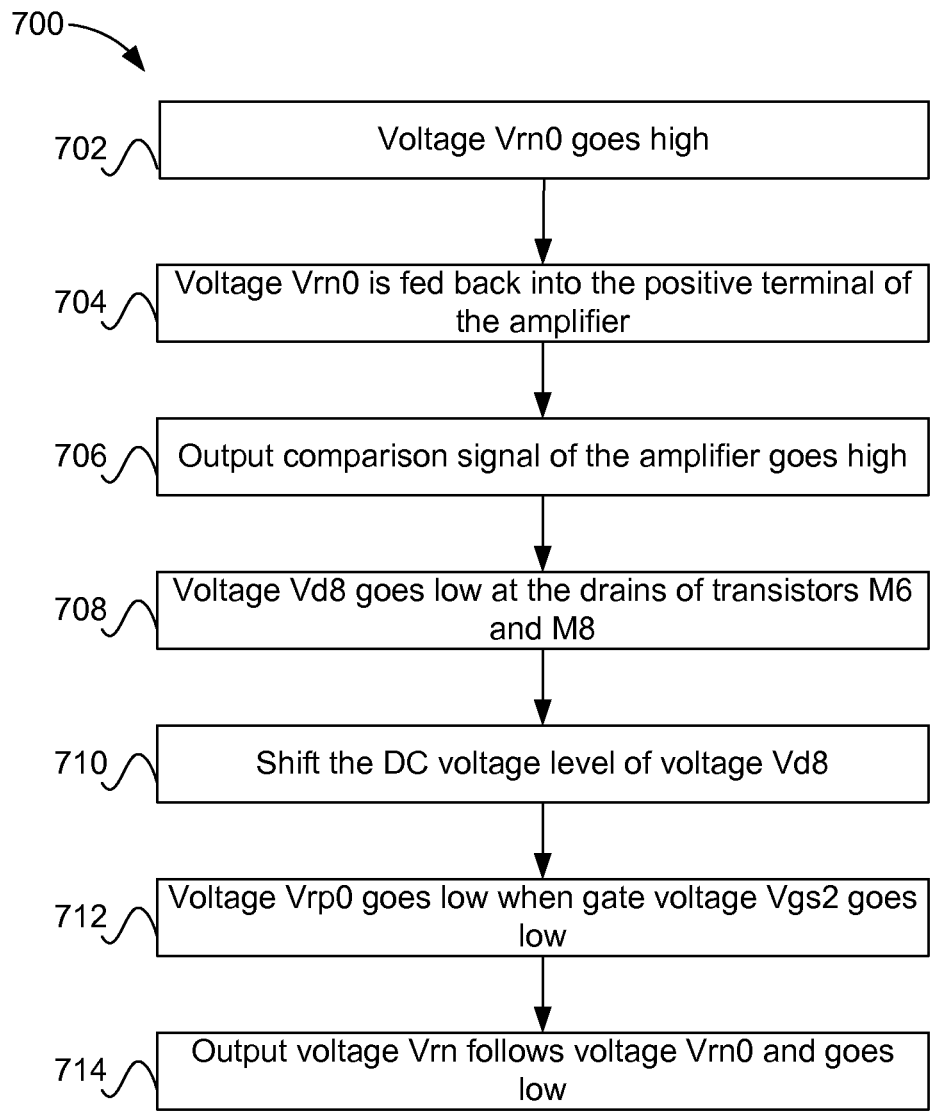
FIG. 7 depicts a simplified flowchart of a method for providing feedback for using voltage Vrn0 according to one embodiment.

FIG. 7 depicts a simplified flowchart 700 of a method for providing feedback for using voltage Vrn0 according to one embodiment. At 702, voltage Vrn0 goes high. For example, voltage Vrn0 may increase due to output node Vrn being coupled to the sampling capacitors of the ADC. At 704, voltage Vrn0 is fed back into the positive terminal of amplifier 304b. When voltage Vrn0 goes above reference voltage Vrefn, at 706, the output comparison signal in amplifier 304b goes high.

At 708, the drain voltage Vd8 goes low at the drains of transistors M6 and M8. At 710, level shifter 302b shifts the voltage Vd8 to a lower level. This causes gate voltage Vgs2 to go low. At 712, voltage Vrn0 then goes low when gate voltage Vgs2 goes low. At 714, output voltage Vrn follows voltage Vrn0 and goes low.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents may be employed without departing from the scope of the invention as defined by the claims.

What is claimed is:

1. An apparatus comprising:
   a first voltage source configured to provide a first supply voltage;
   a second voltage source configured to provide a second supply voltage;
   level shifter circuitry configured as a first voltage battery to shift a first voltage and a second voltage battery to shift a second voltage, wherein the shifted first voltage is greater than the first supply voltage and the shifted second voltage is less than the second supply voltage without employing additional positive or negative boosted supply voltages in the apparatus beyond that of the first supply voltage and the second supply voltage;
   a first circuit configured to:
      receive the shifted first voltage and set a third voltage, and
      receive the shifted second voltage and set a fourth voltage; and
   a second circuit configured to set a fifth voltage and a sixth voltage, the fifth voltage following the third voltage and the sixth voltage following the fourth voltage, wherein the fifth voltage and the sixth voltage are reference buffer output voltages.

2. The apparatus of claim 1, wherein the level shifter circuitry comprises:
   a first capacitor configured to be charged by the first voltage battery or the second voltage battery; and
   a second capacitor configured to be charged by the first capacitor.

3. The apparatus of claim 2, further comprising:
   a first set of switches configured to be controlled to couple the second capacitor to the first capacitor to charge the second capacitor; and
   a second set of switches configured to be controlled to couple the first voltage battery or the second voltage battery to the first capacitor to charge the first capacitor.

4. The apparatus of claim 1, further comprising:
   a third circuit, wherein the first voltage battery is coupled between the third circuit and the first circuit; and
   a fourth circuit, wherein the second voltage battery is coupled between the fourth circuit and the first circuit.

5. The apparatus of claim 4, further comprising a fifth circuit configured to:
   output a first comparison signal based on a comparison of the first voltage and a first reference voltage, the first comparison signal being input into the third circuit; and
   output a second comparison signal based on a comparison of the second voltage and a second reference voltage, the second comparison signal being input into the fourth circuit.

6. The apparatus of claim 4, wherein:
   the first circuit, second circuit, and the third circuit are coupled to the first supply voltage, and
   the first circuit, second circuit, and the fourth circuit are coupled to the second supply voltage.

7. The apparatus of claim 1, wherein:
   the first circuit and the second circuit source current when the fifth voltage falls below a first level; and
   the first circuit and the second circuit sink current when the sixth voltage rises above a second level.

8. The apparatus of claim 1, wherein the first voltage battery and the second voltage battery provide a direct current (DC) shift.

9. An apparatus comprising:
   a first voltage source configured to provide a first supply voltage;
   a second voltage source configured to provide a second supply voltage;
   a first amplifier configured to receive i) a first reference voltage and ii) a first feedback voltage, and output a first comparison signal;
   a first level shifter configured as a first voltage battery to shift a first comparison voltage determined from the first comparison signal;
   a first transistor configured to receive the shifted first comparison voltage as a first gate voltage and configured to set the first feedback voltage, wherein the first gate voltage is greater than the first supply voltage without employing an additional positive boosted supply voltage in the apparatus beyond that of the first supply voltage;
   a second transistor configured to set a first output voltage, wherein the first output voltage is a first reference buffer output voltage and follows the first feedback voltage;
   a second amplifier configured to receive i) a second reference voltage and ii) a second feedback voltage, and output a second comparison signal;
   a second level shifter configured as a second voltage battery to shift a second comparison voltage determined from the second comparison signal;
   a third transistor configured to receive the shifted second comparison signal as a second gate voltage and configured to set the second feedback voltage, wherein the second gate voltage is less than the second supply voltage without employing an additional negative boosted supply voltage in the apparatus beyond that of the second supply voltage; and
   a fourth transistor configured to set a second output voltage, wherein the second output voltage is a second reference buffer output voltage and follows the second feedback voltage.

10. The apparatus of claim 9, further comprising:
    a first gain circuit comprising a fifth transistor and a sixth transistor, the first gain circuit amplifying the first comparison signal to the first comparison voltage;
    a second gain circuit comprising a seventh transistor and a eighth transistor, the second gain circuit amplifying the second comparison signal to the second comparison voltage, wherein the first level shifter is coupled between drains of the fifth transistor and the sixth transistor and the gates of the first transistor and the second transistor, and wherein the second level shifter is coupled between drains of the seventh transistor and the eighth transistor and the gates of the third transistor and the fourth transistor.

11. The apparatus of claim 10, wherein the first level shifter and the second level shifter do not provide a constant current.

12. The apparatus of claim 10, wherein:

the first supply voltage is coupled to the first gain circuit, the first transistor, the second transistor, the fifth transistor, and the seventh transistor, and the second supply voltage is coupled to the second gain circuit, the third transistor, the fourth transistor, the sixth transistor, and the eighth transistor.

13. The apparatus of claim 9, wherein:

when the first output voltage goes low, a current through the second transistor is increased to increase the first output voltage, and when the second output voltage goes high, a current through the fourth transistor is sunk to decrease the second output voltage.

14. The apparatus of claim 9, wherein the first level shifter circuitry comprises:

a first capacitor configured to be charged by the first voltage battery; and a second capacitor configured to be charged by the first capacitor, wherein the second level shifter circuitry comprises:

a third capacitor configured to be charged by the second voltage battery; and a fourth capacitor configured to be charged by the third capacitor.

15. The apparatus of claim 14, further comprising:

a first set of switches configured to be controlled to couple the second capacitor to the first capacitor to charge the second capacitor;

a second set of switches configured to be controlled to couple the first voltage battery to the first capacitor to charge the first capacitor;

a third set of switches configured to be controlled to couple the third capacitor to the fourth capacitor to charge the fourth capacitor; and a second set of switches configured to be controlled to couple the second voltage battery to the third capacitor to charge the third capacitor.

16. The apparatus of claim 9, wherein the first voltage battery and the second voltage battery provide a direct current (DC) shift of the first comparison voltage and the second comparison voltage, respectively.

17. A method comprising:

shifting a first voltage using a first voltage battery;

shifting a second voltage using a second voltage battery;

receiving the shifted first voltage and setting a third voltage, wherein the shifted first voltage is greater than a first supply voltage without employing an additional positive boosted supply voltage beyond that of the first supply voltage;

receiving the shifted second voltage and setting a fourth voltage, wherein the shifted second voltage is less than a second supply voltage without employing an additional negative boosted supply voltage beyond that of the second supply voltage;

setting a fifth voltage based on the shifted first voltage, the fifth voltage following the third voltage and representing a first reference buffer output voltage; and setting a sixth voltage based on the shifted second voltage, the sixth voltage following the fourth voltage and representing a second reference buffer output voltage.

18. The method of claim 17, further comprising:

receiving a first reference voltage and the third voltage;

outputting a first comparison signal;

determining the first voltage from the comparison signal;

receiving a second reference voltage and the fourth voltage;

outputting a second comparison signal; and determining the second voltage from the second comparison signal.

19. The method of claim 17, wherein the first voltage battery and the second voltage battery provide a direct current (DC) shift of the first comparison voltage and the second comparison voltage, respectively.

20. The method of claim 17, wherein:

when the third voltage goes low, the method further comprising sourcing a current to increase the third voltage, and when the sixth voltage goes high, the method further comprising sinking the current to decrease the sixth voltage.

* * * * *